United States Patent [19]

Tsuji et al.

[11] Patent Number: 4,985,374
[45] Date of Patent: Jan. 15, 1991

[54] MAKING A SEMICONDUCTOR DEVICE WITH AMMONIA TREATMENT OF PHOTORESIST

[75] Inventors: Hitoshi Tsuji, Yokohama; Hiroshi Haraguchi, Tokyo; Osamu Hirata, Kawasaki; Hidetsuna Hashimoto, Kitakyushu, all of Japan

[73] Assignee: Kabushiki Kaisha Toshiba, Kawasaki, Japan

[21] Appl. No.: 544,374

[22] Filed: Jun. 27, 1990

[30] Foreign Application Priority Data

Jun. 30, 1989 [JP] Japan .................................. 1-169052
Jun. 30, 1989 [JP] Japan .................................. 1-169053

[51] Int. Cl.$^5$ ............................................ H01L 21/47
[52] U.S. Cl. .................... 437/229; 437/238; 437/241; 430/312; 148/DIG. 137
[58] Field of Search .............. 437/229, 177, 947, 189; 148/DIG. 51; 430/312

[56] References Cited

U.S. PATENT DOCUMENTS

| | | | |
|---|---|---|---|
| 4,315,984 | 2/1982 | Okazaki et al. | 437/229 |
| 4,523,976 | 6/1985 | Bukhman | 437/187 |
| 4,568,631 | 2/1986 | Badami et al. | 430/312 |
| 4,775,609 | 10/1988 | McFarland | 437/229 |
| 4,842,991 | 6/1989 | Brighton | 437/229 |
| 4,885,231 | 12/1989 | Chan | 430/321 |

FOREIGN PATENT DOCUMENTS

| | | | |
|---|---|---|---|
| 0002654 | 1/1981 | Japan | 437/189 |
| 0084722 | 3/1989 | Japan | 437/947 |
| 253918 | 10/1989 | Japan . | |

Primary Examiner—Brian E. Hearn
Assistant Examiner—Michael Trinh
Attorney, Agent, or Firm—Finnegan, Henderson, Farabow, Garrett and Dunner

[57] ABSTRACT

A manufacturing method of a semiconductor device of the present invention comprises a first step of exposing a periphery of a first region of a photoresist layer coating an insulating layer formed on a semiconductor substrate and a periphery of a second region for positioning, and a second step of heating said photoresist layer in ammonia atmosphere and forming an alkali insoluble portion in the periphery of the first region and that of the second region, a third step of exposing a third region, which is smaller than the first region, and the second region and developing these regions, a fourth step of etching the third region and the second region to a predetermined depth, and a fifth step of repeating the third and fourth steps once or more in a region, which is smaller than the third region, and the second region.

16 Claims, 6 Drawing Sheets

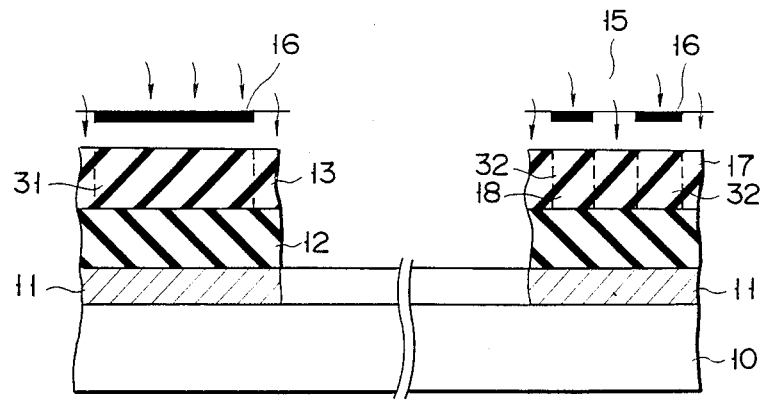
F I G. 4A
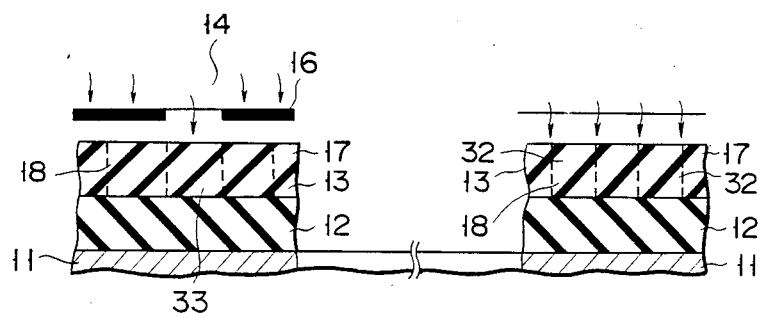
F I G. 4B
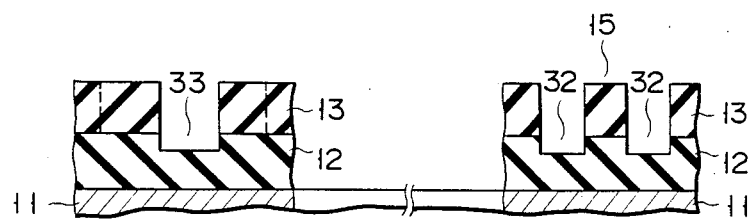
F I G. 4C

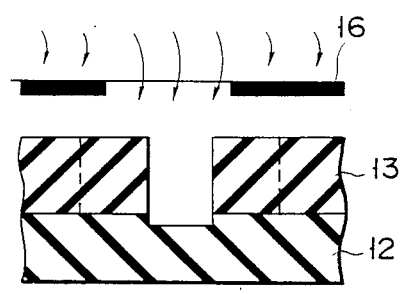
F I G. 5A
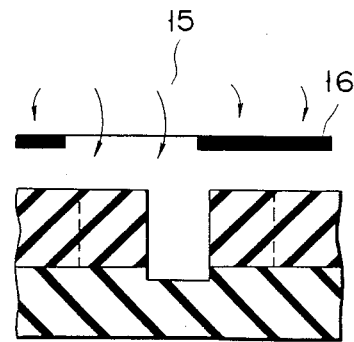
F I G. 6A
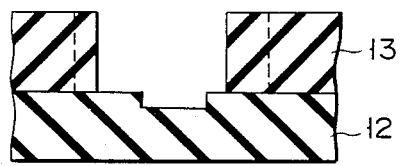
F I G. 5B
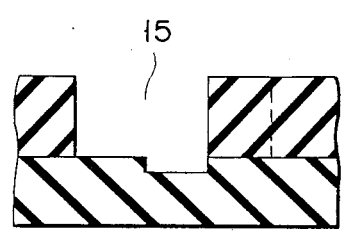
F I G. 6B
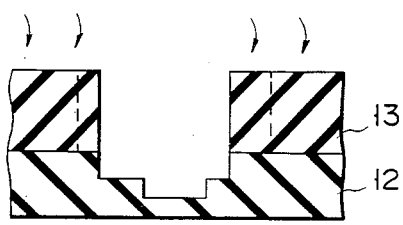
F I G. 5C
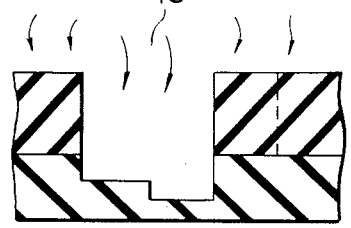
F I G. 6C
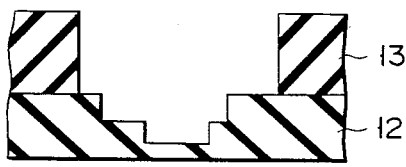
F I G. 5D
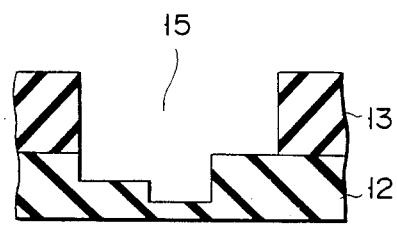
F I G. 6D

MAKING A SEMICONDUCTOR DEVICE WITH AMMONIA TREATMENT OF PHOTORESIST

BACKGROUND OF THE INVENTION

1. Field of the Invention

The present invention relates to a technique of lithography and, particularly to a manufacturing method for semiconductor device wherein a stepwise taper is formed in a contract hole, that is, a opening portion, which is formed in an insulating film and metal, by the combination of a resist patterning process and a dry etching process.

2. Description of the Related Art

As is known, the degree of integration of the semiconductor element has been improved with the advance of a fine process technique of the semiconductor element. For the purpose of fining, the so-called multilayered wiring element has been generally used. In order to control leak current generated in the element, the necessary an interlayered insulating film is formed to have the thickness of 1 μm or more regardless of quality. Thereby, the depth of the opening portion, which is formed in the interlayered insulating film, is increased.

As one of the fine process techniques, the frequency in use of a dry etching such as a reactive ion etching, in which an anisotropic etching is performed, is increased. For this reason, the side wall of the opening portion, which is formed in the interlayered insulating film, becomes almost vertical. Therefore, in a case where the inside of the opening portion cannot be completely embedded with the metal layer for wiring, which is deposited on the interlayered insulating film, the connection between the electrode in the opening portion and the external wiring layer is defective. To overcome this problem, there is known a method for forming taper in the opening portion contacting the wiring metal layer, that is, 20 to 30% of the entire depth, by using the combination of a chemical reaction or a physical etching.

Also, an image reversal process which can be used as the fine process technique was disclosed in Vacuum, Vol. 29, No. 12, 1989, page 585. Specifically, a mask, in which a layer interrupting light is formed, is superimposed at a predetermined position of a positive resist of a novolak type, an exposing process, which is a part of a photo engraving process, is provided therein, so that a photosensitive portion is formed therein other than the light interrupting layer of the mask. However, if this lamination layer is processed in ammonia atmosphere, the exposed and photosensitive indene carboxylic acid generates decarboxylic acid, insoluble indene is formed in alkali developer. If this phenomenon is used, a pattern to be originally formed is reversed. FIG. 1 illustrates an example of forming taper by the combination of the chemical etching and the physical etching. More specifically, a wiring layer forming of Al or Al alloy or an electrode 2 is directly or indirectly deposited on a semiconductor substrate 1 via a coating layer, and an interlayered insulating layer 3 is entirely deposited thereon.

Then, an opening portion 4 is formed on the interlayered insulating layer 3 by CDE process as a chemical etching, in which radical, which is generated by plasma generated by a magnetron tube, is moved to the distant position and RIE process as a physical etching. The edge of the opening portion 4 is etched in a certain horizontal and vertical isotropic direction by CDE process. Due to this, as is obvious from the drawing, a taper 6 is formed and a double edge is formed in positioning marks 5, which are used in an aligner process, as shown in FIG. 2. FIG. 2 is a plane view of the opening portion 4 for the positioning marks 5 seen from the above.

Moreover, FIG. 3 is a cross sectional view showing the opening portion 4 formed by providing image reversal process in the interlayered insulating layer 3. However, the side wall of the opening portion 4 is not vertically formed, and the double edge is formed in the positioning marks which are formed at the same with the above process. This causes the deterioration of the accuracy of the positioning.

In a case where the taper is formed in the opening portion 4 by the combination of the chemical etching and the physical etching, the positioning marks 5 are shaped similarly and the edges of the positioning marks look double as shown in FIG. 2. In general, to detect the positioning marks 5, reflected light of the irradiated laser is electrically compared between a setting coordinate and a measuring coordinate. Then, if the edges are discriminated several times, a plurality of detection signals are obtained, so that the positioning step fails or the accuracy of positioning is deteriorated.

Moreover, if the opening portion and the positioning marks are formed by use of the image reversal process, both the opening portion and the positioning marks are simultaneously formed, so that the taper 6 is formed in the positioning marks. As a result, since a detection signal having a clear waveform is not obtained, the accuracy of the positioning is deteriorated. In addition, regarding etching, it is difficult to set conditions such as an angle of a reverse taper and controllability and there is problem in reproductivity.

SUMMARY OF THE INVENTION

An object of the present invention is to provide a manufacturing method for a semiconductor element wherein an opening portion having a sufficient coverage and positioning marks having high accuracy are simultaneously formed.

The manufacturing method for semiconductor of the present invention comprises a first step (FIG. 4A) of exposing a periphery of a first region (31) of a photoresist layer (18) coating an insulating layer (12) formed on a semiconductor substrate (10) and a periphery of a second region (32) for positioning; a second step (FIG. 4A) of heating said photoresist layer (13) in ammonia atmosphere and forming an alkali insoluble portion in the periphery of the first region (31) and that of the second region (32); a third step (FIG. 4B) of exposing a third region (33), which is smaller than the first region (31), and the second region (32) and developing these regions; a fourth step (FIGS. 4B and 4C) of etching the third region (33) and the second region (32) to a predetermined depth; and a fifth step (FIG. 4D, FIG. 4E, FIG. 4F) of repeating the third and fourth steps are repeated once or more in a region, which is smaller than the third region (33), and the second region (32).

According to the manufacturing method for semiconductor of the present invention, alkali insoluble portion is formed in the periphery of the first region (31) by image reversal process of the first step (FIG. 4A) and the second step (FIG. 4A).

Because of the presence of alkali insoluble portion, even if exposing is erroneously performed in a larger range than the first region (31) and the developing is performed when the region is sequentially narrowed in the range of the first region (31) in the third step and the following steps, the region, in which the image reversal process is provided, is not etched.

Also, in a case of etching positioning marks (32) for positioning, even if the range of the exposure and development is erroneously set in the third step, the etching position is not changed and a vertical side wall can be obtained because of the presence of alkali insoluble portion in the first and second steps.

Moreover, the region is sequentially narrowed in the third step and the following steps, and the exposure and development are stepwise repeated, and etching is performed to a predetermined depth. Thereby, an insulating layer (12) having a stepwise taper can be formed. By this shape, the covering of the insulating layer (12) can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4G are cross sectional views showing each step of the manufacturing method of the present invention;

FIGS. 5A to 5D are cross sectional views showing the shift of mask positioning in each step of the manufacturing method of the present invention;

FIGS. 6A to 6D are cross sectional views showing the larger shift of mask positioning in each step of the manufacturing method of the present invention;

DETAILED DESCRIPTION OF THE PREFERRED EMBODIMENTS

Figure 1:
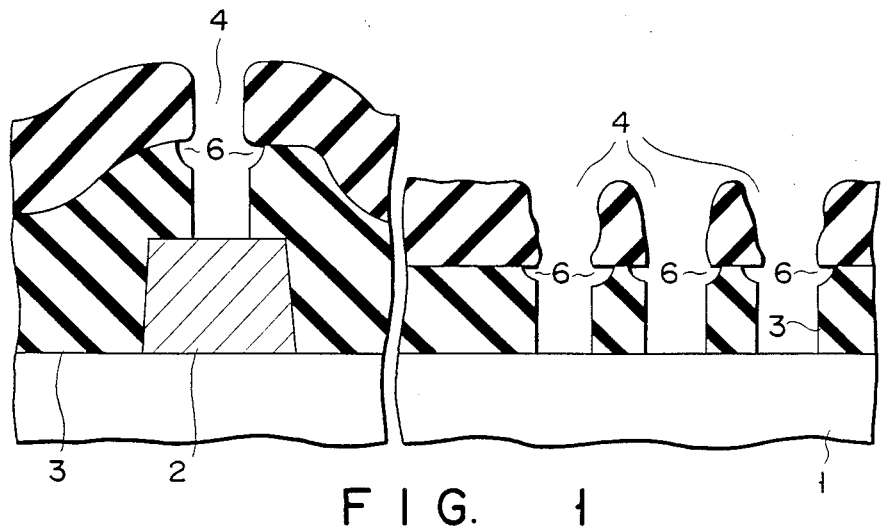
FIG. 1 is a cross sectional view showing an opening portion and a positioning mark to which the present invention is not applied.
Figure 2:
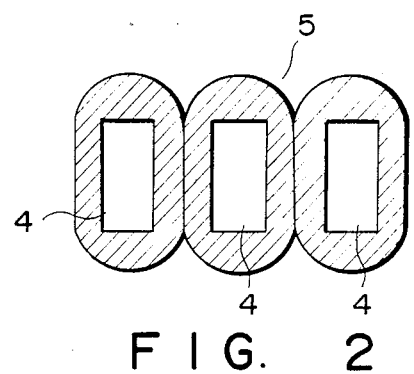
FIG. 2 is an upper view of the positioning mark to the present invention is not applied.
Figure 3:
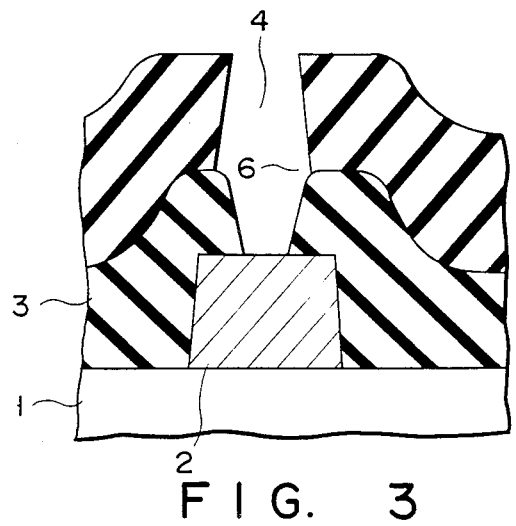
FIG. 3 is a cross sectional view of an opening portion when an image reversal process is performed.
Figure 4D:
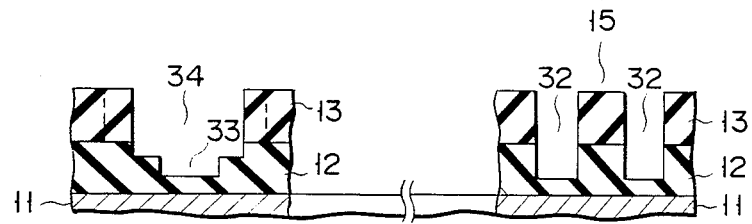
Figure 4E:
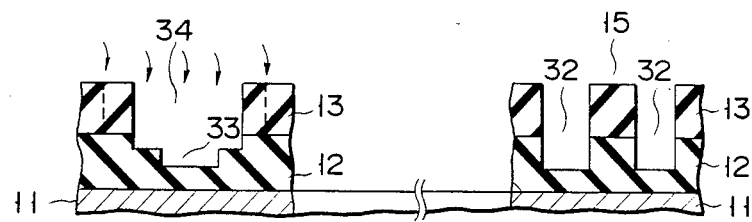
Figure 4F:
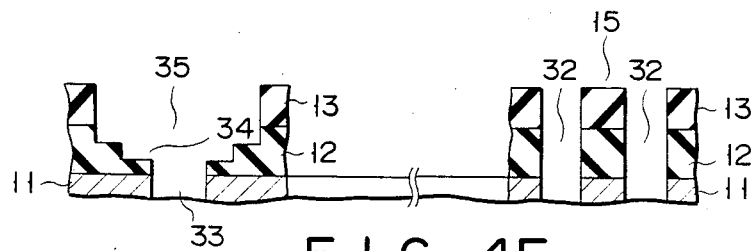
Figure 4G:
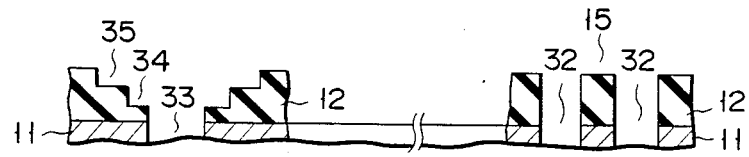

FIGS. 4A to 4G illustrate an embodiment in which an opening portion is formed in an interlayered insulating film which is indispensable to a multi-wiring. FIG. 4A shows an image reversal process which a part of the manufacturing method of the present invention. FIG. 4B shows the state in the course of the first exposing and developing processes. FIG. 4C shows the result of the first exposing and developing processes. FIG. 4D shows the result of the second exposing and developing processes. FIG. 4E shows the state in the course of the third exposing and developing processes. FIG. 4F is the result of the third exposing and developing processes. FIG. 4G shows the result of which all resists are etched.

On a semiconductor substrate 10, there is provided a wiring layer, which is formed of Al or Al alloy (Al-Si-Cu, Al-Si) directly or indirectly via an oxide layer, or an electrode 11. An impurity material is introduced and diffused in the semiconductor substrate 10 showing an opposite conductivity type, thereby an active layer or a passive layer is formed and electrically connected to the wiring layer or the electrode 11.

An interlayered insulating film 12, which is formed of a single layer consisting of silicon oxide or silicon nitride, or a composite layer, is coated on the entire surface of the semiconductor substrate 10 including a coated layer. Thereafter, novolak system posiresist 13 having thickness of 1 $\mu$m or more ("NPR-820" which is a trademark of Nagase Sangyosha) is coated thereon (FIG. 4A). In FIGS. 4A to 4G, an opening portion 14 is shown on the left side of the paper and a positioning mark 15 is shown on the right of the paper.

After prebake process is provided in the posiresist 13 in atmosphere, mask 16 . . . are provided at the position where exposure is not carried out, that is, the portion where opening portion 14 and positioning mark 15 are formed as is obvious from FIG. 4B. Thereafter, a first exposing step using ultraviolet ray is provided therein by a taper. In the drawing, arrows denote ultraviolet ray, and resist layer 18 and unexposed layer 17 are illustrated. In the first exposing step, a pattern for opening portion and a reversed mask are originally used.

Moreover, the image reversal process explained in the prior art is performed in ammonia atmosphere at temperature of 90° to 100° C., and the resist layer 18 exposed by the first exposing step becomes insoluble. A heating furnace, which performs this step, provides a preprocess in which nitrogen purge is repeated by a rotary pump to remove oxygen and water, thereby reducing the pressure to 30 to 100 torr. Here, the second exposing step is performed by use of the pattern which is smaller than that of the first exposing step. The entire surface of the positioning mark 15 is exposed by use of the mask shown in FIG. 4B and the opening portion 14 and the resist for the positioning mark 15 are alkali-developed by choline. Then, the interlayered insulating film 12 is etched by use of the obtained pattern, thereby obtaining the shape shown in the cross sectional view of FIG. 4C.

Moreover, in the third exposing step, the pattern, which is larger than that of the second exposing step, is exposed by use of the positioning mark 15 formed in the second exposing step, and developing and local etching are repeated again. In this case, since the size of the image pattern formed in the first exposing step is unchanged, the positioning mark 15 is intermittently etched. The same steps can be repeated n times. In FIG. 4, these steps are repeated three times, thereby the stepwise taper is formed in the opening portion 14 and a pattern having a profile, which is perpendicular to the side wall of the mark 15, is formed. FIG. 4D is a cross sectional view showing the end of the developing and etching performed after the third exposing step. FIG. 4E is a cross sectional view showing the end of the developing and etching performed after n exposing step. FIG. 4F is a cross sectional view showing the end of the developing and etching performed thereafter. FIG. 4G shows the state in which the resist is separated.

FIGS. 5A to 5D are cross sectional views showing a case in which the shift of mask positioning is formed in each exposing step in the pattern formation of the opening portion in the same manufacturing steps as FIGS. 4A to 4G.

FIGS. 6A to 6D are cross sectional views showing a case in which the shift of mask positioning is extremely largely generated. In other words, FIG. 5A shows a cross section after all steps, the first exposing step + the image reversal process + the second exposing step + local etching + the third exposing step, are finished. FIGS. 5B and 6B show the state after the developing step, which is performed after the third exposing step, is finished. FIGS. 5D and 6D show the state after the etching + the final entire surface exposing step are finished. FIGS. 5C and 5C show cross sections after the final developing is finished.

As is obvious from each drawing, by use of the image reversal process, even if the first exposing pattern is extremely shifted after the second exposing step, the shift of the pattern is not generated in the developing step thereafter, so that shift can be controlled to a certain extent that the distance between the stepwise tapers is different.

Moreover, the stepwise taper is formed in the pattern for the opening portion. However, since the pattern for the positioning mark can be formed to be substantially perpendicular to the side wall, failure in the positioning steps thereafter is reduced and the accuracy of the masking can be improved as compared with the prior art.

Furthermore, the deposition of the opening portion having a stepwise taper, which is formed of Al or Al alloy layer, can obtain a sufficient coverage.

Additionally, other embodiment of the present invention will be explained as follows:

In the semiconductor element, it is general to form an active layer or a passive layer by introducing and diffusing an impurity material in a semiconductor substrate showing an opposite conductivity type, thereby forming an active layer or a passive layer, and provide an opening portion in a wiring layer, which is electrically connected to both the active layer and the passive layer, or an electrode. Moreover, a positioning mark is formed in an insulating layer, which is adhered to the semiconductor substrate and adjacent to the opening portion. In an element using a multilayered wire, an interlayered insulating film is formed to cover the wiring layer or the electrode introduced to the insulating layer serving as a first layer. In this case, the opening portion and the positioning mark must be formed.

In the present invention, insulating material layers, which are superimposed on the semiconductor substrate, include the above-mentioned multilayered wiring element and the single wiring element. An embodiment, in which an opening portion and a positioning mark are formed in an interlayered insulating film of the multilayered wiring semiconductor element, will be explained with reference to FIGS. 7A to 7F.

Figure 7A:
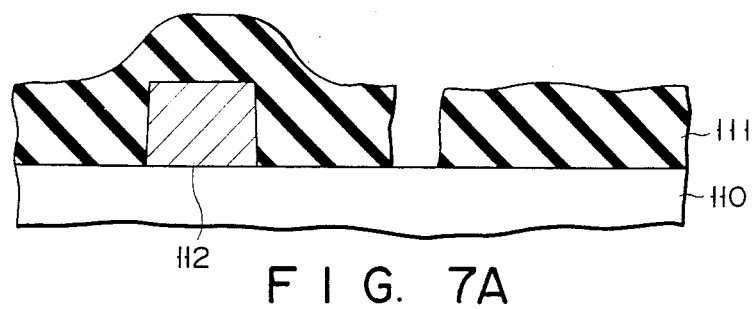
FIGS. 7A to 7F are cross sectional views showing each step of the other manufacturing method of the present invention.
Figure 7B:
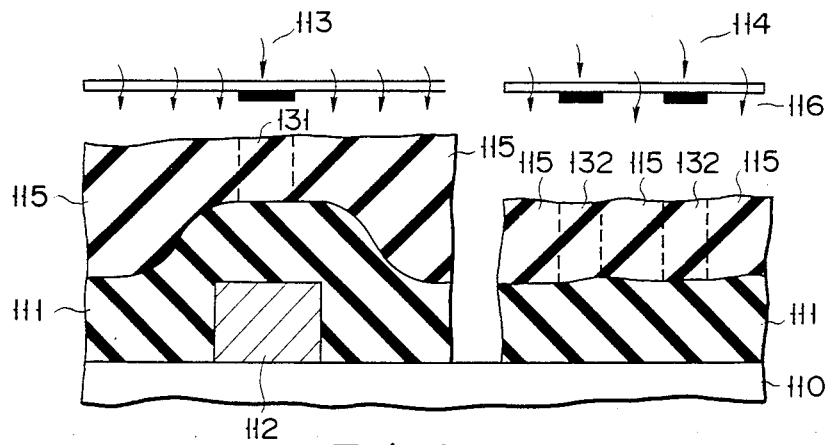
Figure 7C:
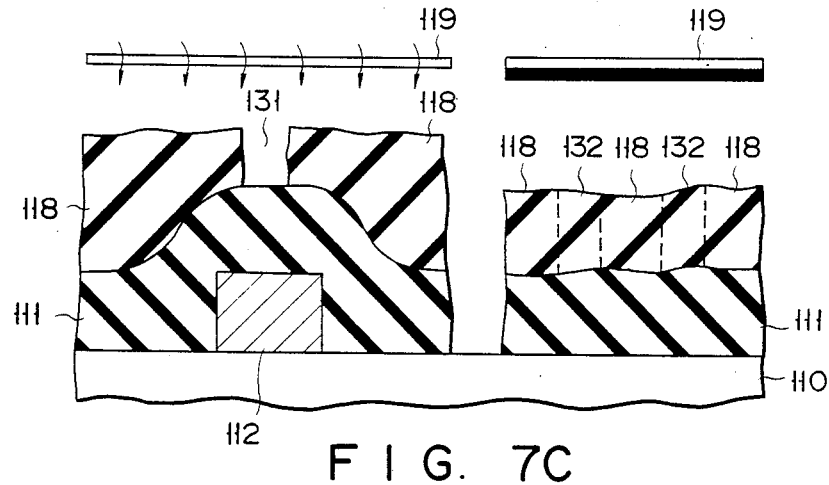
Figure 7D:
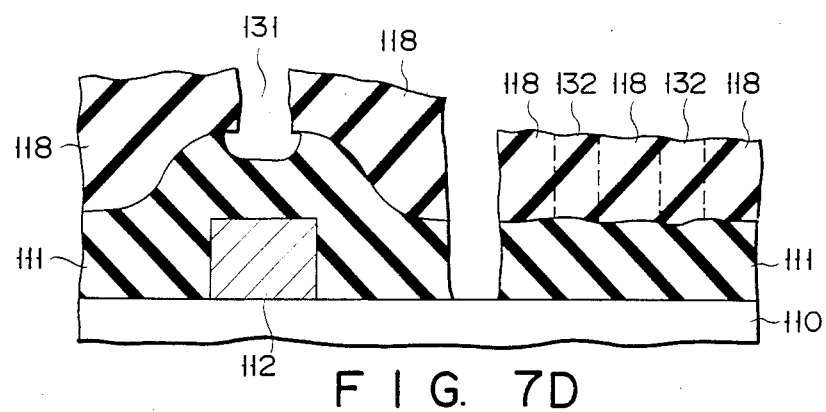
Figure 7E:
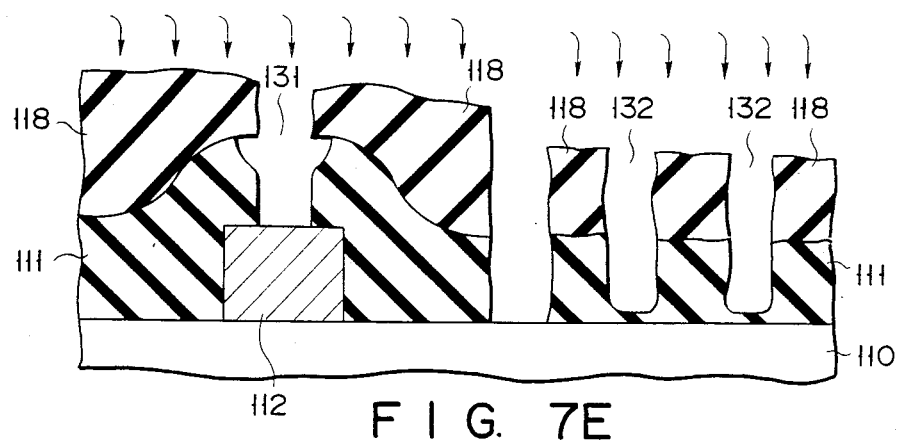
Figure 7F:
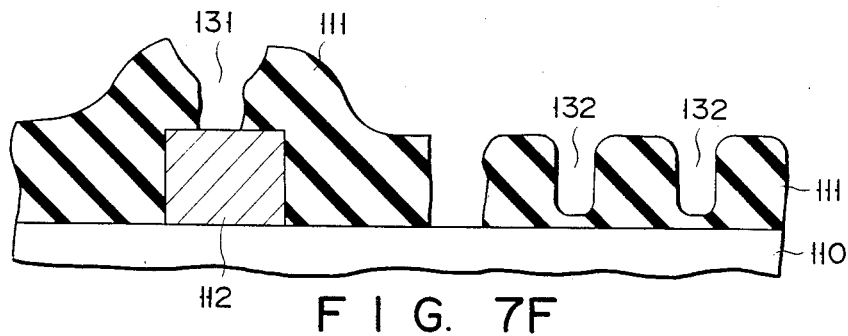

FIG. 7A shows a semiconductor substrate to which the other manufacturing method of the present invention is applied. Reference numeral 110 is a semiconductor substrate; 111: a resist; and 112: a wiring layer for wiring. FIG. 7B shows a semiconductor substrate in which an image reversal process is performed. FIG. 7C shows a step in which exposing and developing processes are performed in an opening portion 131. FIG. 7D shows a step in which an isotropic etching is performed in the opening portion 131. FIG. 7E shows a step in which a dry etching is performed in the semiconductor substrate. FIG. 7F shows a step in which the resist is removed.

The outline of this manufacturing method will be explained as follows.

Specifically, this manufacturing method comprises a first step (FIG. 7B) of exposing the peripheral portion of a first region (131) of a photoresist layer (115) coating an insulating layer (111) formed on a semiconductor substrate (110) and the peripheral portion of a second region (132) for positioning; a second step (FIG. 7C) of heating the photoresist layer (115) in ammonia atmosphere, and forming alkali insoluble portion in the peripheral portion of the first region (131) and that of the second region (132); a third step (FIG. 7D) of performing an isotropic etching of the first region (131) to a predetermined depth; and a fourth step (FIG. 7E) of performing a dry etching of the first and second regions (131, 132).

As shown in FIG. 7A, the insulating layers, which are superimposed on the semiconductor substrate 110, cover the wiring layer formed of Al or Al alloy (Al - Si - Cu, Al - Si) and the electrode (112). Then, in order to form the opening portion 131 and the positioning mark 132 at a predetermined position by PEP (Photo Engraving Process), a posiresist layer 115 having thickness of 1 $\mu$m or more ("NPR-820" which is a trademark of Nagase Sangyosha) is coated thereon. In FIGS. 7A to 7F, the opening portion 131 is shown on the left side of the paper and the positioning mark 132 is shown on the right of the paper.

In the posiresist layer 115, there is provided a pattern to be originally formed, which is reversed and exposed by the so-called aligner. In this process, as shown in FIG. 7B, under the presence of a mask 116 interrupting the position where the opening portion 131 and the positioning mark 132 are to be formed, such a pattern is exposed by ultraviolet ray (arrow in FIGS. 7B, 7C, 7D, and 7E) in the above-mentioned manner. As shown in FIG. 7B, the opening portion 131 and the positioning mark 132 of the posiresist layer 115 corresponding to the mask 116 are not exposed.

Moreover, the image reversal process explained in the prior art is performed in ammonia atmosphere at temperature of 90° to 100° C., and decarboxyic reaction is generated in inden carboxylic acid exposed in the first exposing step, thereby forming insoluble inden 118 in alkali developer. The inden 118 is also formed in the posiresist layer 115 forming the positioning mark 132.

In a heating furnace performing this step, nitrogen purge is repeated by a rotary pump to remove oxygen and water, thereby reducing the pressure to 100 torr.

Figure 8:
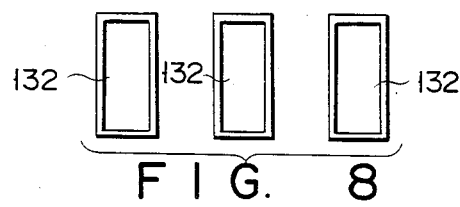
FIG. 8 is an upper view of the positioning mark formed by the manufacturing method shown in FIGS. 7A to 7F.

As shown in FIG. 7C, an exposing step is performed by use of the mask 119 in order that only the opening portion 131 is exposed and the positioning mark 132 is not exposed. Moreover, if alkali-developing is performed, only the pattern of the opening portion 131 is developed. Sequentially, by use of the pattern of the opening portion 131, isotropic chemical dry etching, that is, CDE process is performed. As a result, as shown in FIG. 7D, a pattern having an opening surface, which is led to the pattern of the opening pattern 131 and wider, is partially formed in the insulating layer 111. Furthermore, a step in which the entire thickness of the insulating layer 111, and a step, in which the resist layer 132, which is not exposed in the positioning mark, is exposed, developed, and etched, are simultaneously or individually performed, thereby obtaining the cross section shown in FIG. 7E. This etching is used to form a substantially vertical side wall by use of RIE process and detect the positioning mark 132 by laser. Also, the posiresist layer 118 is separated, thereby obtaining the structure having a cross section shown in FIG. 7E. As mentioned above, alkali solution such as choline is used as a developer. FIG. 8 shows an upper view of the positioning mark 132 which is formed by the method of the present invention. After a series of these steps, the posiresist layer is removed and these steps will, as a matter of course, follow the next step, that is, the formation of PSG as an On Al Passivation layer or nitrogen silicon layer, or that of a mixing layer of both layers. It is needless to say that the method of the present invention can be applied to the multilayered semiconductor element other than the examiner of the two-layered wiring.

According to the method of the present invention, since a vertical wall surface can be obtained without generating a taper around a positioning mark, the generation of a large positioning shift in the patterning which is the next process using an aligner and the mode such as non-detection of a detection signal are reduced. For this reason, the accuracy of the positioning of the wiring pattern such as Al, which is deposited on the opening portion, thereby making it possible to improve productivity.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A manufacturing method of semiconductor device comprising:
    a first step of exposing a periphery of a first region of a photoresist layer coating an insulating layer formed on a semiconductor substrate and a periphery of a second region for positioning;
    a second step of heating said photoresist layer in ammonia atmosphere and forming an alkali insoluble portion in a periphery of said first region and that of said second region;
    a third step of exposing a third region, which is smaller than said first region, and said second region and developing these regions;
    a fourth step of etching said third region and said second region to a predetermined depth; and
    a fifth step of repeating said third and fourth steps once or more in a region, which is smaller than said third region, and said second region.

2. A manufacturing method according to claim 1, wherein said fourth step includes a dry etching process.

3. A manufacturing method according to claim 1, further comprising a sixth step of removing said photoresist layer after said fifth step.

4. A manufacturing method according to claim 1, wherein said photoresist layer includes a novolak posiresist.

5. A manufacturing method according to claim 1, wherein said insulating layer includes silicon oxide.

6. A manufacturing method according to claim 1, wherein said insulating layer includes silicon nitride.

7. A manufacturing method according to claim 1, wherein said developer uses choline.

8. A manufacturing method according to claim 1, wherein said ammonia atmosphere is 90° to 100° C.

9. A manufacturing method of semiconductor device comprising:
    a first step of exposing a periphery of a first region of a photoresist layer coating an insulating layer formed on a semiconductor substrate and said periphery of a second region for positioning;
    a second step of heating said photoresist layer in ammonia atmosphere, and forming alkali insoluble portion in the periphery of said the first region and that of the second region;
    a third step of performing an isotropic etching of said first region to a predetermined depth; and
    a fourth step of performing an anisotropic etching of said first and second regions.

10. A manufacturing method according to claim 9, wherein said isotropic etching is a dry etching.

11. A manufacturing method according to claim 9, further comprising a fifth step of removing said photoresist after said fourth step.

12. A manufacturing method according to claim 9, wherein said photoresist layer is a novolak posiresist.

13. A manufacturing method according to claim 9, wherein said insulating layer includes silicon oxide.

14. A manufacturing method according to claim 9, wherein said insulating layer includes silicon nitride.

15. A manufacturing method according to claim 9, wherein said developer uses choline.

16. A manufacturing method according to claim 9, wherein said ammonia atmosphere is 90° to 100° C.

* * * * *

UNITED STATES PATENT AND TRADEMARK OFFICE
CERTIFICATE OF CORRECTION

PATENT NO. : 4,985,374
DATED    : January 15, 1991
INVENTOR(S) : Hitoshi Tsuji et al.

It is certified that error appears in the above-identified patent and that said Letters Patent is hereby corrected as shown below:

Claim 9, column 8, line 24, after "step" change "cf" to --of--.

Signed and Sealed this

Sixth Day of April, 1993

Attest:

STEPHEN G. KUNIN

*Attesting Officer*    Acting Commissioner of Patents and Trademarks